US011222952B2

(12) United States Patent
Yang et al.

(10) Patent No.: US 11,222,952 B2
(45) Date of Patent: Jan. 11, 2022

(54) GATE ALL AROUND TRANSISTORS WITH HIGH CHARGE MOBILITY CHANNEL MATERIALS

(71) Applicant: QUALCOMM Incorporated, San Diego, CA (US)

(72) Inventors: Bin Yang, San Diego, CA (US); Haining Yang, San Diego, CA (US); Xia Li, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/749,897

(22) Filed: Jan. 22, 2020

(65) Prior Publication Data

US 2021/0226009 A1    Jul. 22, 2021

(51) Int. Cl.
| | | |
|---|---|---|
| *H01L 29/10* | (2006.01) | |
| *H01L 29/16* | (2006.01) | |
| *H01L 29/201* | (2006.01) | |
| *H01L 29/66* | (2006.01) | |
| *H01L 29/78* | (2006.01) | |
| *H01L 29/43* | (2006.01) | |

(52) U.S. Cl.
CPC .......... *H01L 29/1033* (2013.01); *H01L 29/16* (2013.01); *H01L 29/201* (2013.01); *H01L 29/432* (2013.01); *H01L 29/66484* (2013.01); *H01L 29/66522* (2013.01); *H01L 29/7831* (2013.01)

(58) Field of Classification Search
CPC . H01L 29/1033; H01L 29/16; H01L 29/7831; H01L 29/201; H01L 29/432; H01L 29/66484; H01L 29/66522; H01L 29/42392
See application file for complete search history.

(56) References Cited

U.S. PATENT DOCUMENTS

| | | |
|---|---|---|
| 9,484,405 B1 | 11/2016 | Balakrishnan et al. |
| 2014/0091360 A1 | 4/2014 | Pillarisetty et al. |
| 2015/0249139 A1 | 9/2015 | Cheng et al. |

(Continued)

OTHER PUBLICATIONS

Strite S., et al., "Antiphase Domain Free Growth of GaAs on Ge in GaAs/Ge/GaAs Heterostructures", Applied Physics Letters, vol. 56, No. 3, Jan. 15, 1990, pp. 244-246.

(Continued)

*Primary Examiner* — Wasiul Haider
(74) *Attorney, Agent, or Firm* — Qualcomm Incorporated

(57) ABSTRACT

A semiconductor device comprising an N-type metal oxide semiconductor (NMOS) gate-all-around (GAA) transistor and a P-type metal oxide semiconductor (PMOS) GAA transistor with high charge mobility channel materials is disclosed. The semiconductor device may include a substrate. The semiconductor device may also include an NMOS GAA transistor on the substrate, wherein the NMOS GAA transistor comprises a first channel material. The semiconductor device may further include a PMOS GAA transistor on the substrate, wherein the PMOS GAA transistor comprises a second channel material. The first channel material may have an electron mobility greater than an electron mobility of Silicon (Si) and the second channel material may have a hole mobility greater than a hole mobility of Si.

18 Claims, 9 Drawing Sheets

(56) References Cited

U.S. PATENT DOCUMENTS

| | | | |
|---|---|---|---|
| 2017/0179248 A1* | 6/2017 | Pawlak | H01L 29/78696 |
| 2017/0256461 A1 | 9/2017 | Xiao | |
| 2019/0131405 A1 | 5/2019 | Hsiao et al. | |
| 2019/0148376 A1 | 5/2019 | Chanemougame et al. | |
| 2019/0172755 A1 | 6/2019 | Smith et al. | |
| 2019/0341306 A1* | 11/2019 | Yu | H01L 24/09 |
| 2020/0312846 A1* | 10/2020 | Rachmady | H01L 21/8252 |
| 2021/0066506 A1* | 3/2021 | Liaw | H01L 29/78696 |
| 2021/0082686 A1* | 3/2021 | Chiang | H01L 29/42392 |

OTHER PUBLICATIONS

Strite S., et al., "GaAs/Ge/GaAs Heterostructures by Molecular Beam Epitaxy", Journal of Vacuum Science & Technology B: Microelectronics Processing and Phenomena, vol. 8, No. 5, 1990, pp. 1131-1140.

Hudait M.K., et al., "Structural, Morphological, and Band Alignment Properties of GaAs/Ge/GaAs Heterostructures on (100), (110), and (111)A GaAs Substrates", Journal of Vacuum Science & Technology, 2012, 14 Pages.

Ladd G.O., et al., "Performance Potential of High-Frequency Heterojunction Transistors", IEEE Transactions on Electron Devices, vol. ED-17, No. 5, May 1970, pp. 413-420.

Tobin S.P., et al., "High-Efficiency GaAsGe Monolithic Tandem Solar Cells", Conference Record of the Twentieth IEEE Photovoltaic Specialists Conference, Feb. 1988, pp. 405-410.

International Search Report and Written Opinion—PCT/US2021/013004—ISA/EPO—dated Jun. 23, 2021

\* cited by examiner

GATE ALL AROUND TRANSISTORS WITH HIGH CHARGE MOBILITY CHANNEL MATERIALS

BACKGROUND

Field

Certain aspects of the present disclosure generally relate to transistors, and more particularly, to gate all around transistors with high charge mobility channel materials.

Background

Transistors are essential components in modern electronic devices. As modern electronic devices become more complex in functionality, an increasing number of transistors are integrated in such devices. This increase in the number of transistors is achieved in part through continued efforts to reduce the size of transistors. As transistors become smaller, gate lengths of the transistors decrease accordingly, resulting in reduced gate control and degraded transistor performance. To overcome these issues, gate around transistors have been developed. A gate around transistor, such as a fin field effect transistor and a gate-all-around (GAA) transistor, includes a gate material wrapped around at least a portion of a channel structure to provide better gate control over the channel region. Take the GAA transistor for example, it includes a gate material surrounds the channel region.

Silicon (Si) is a widely used semiconductor material in transistors. In a GAA transistor, Si is commonly used as channel materials. However, Si has lower charge mobility compared to some other semiconductor materials, which limits the performance of GAA transistors. To further improve the performance of GAA transistors, channel materials with higher charge mobility are desirable.

SUMMARY

Certain aspects of the present disclosure provide a semiconductor device. The semiconductor device may include a substrate. The semiconductor device may also include an N-type metal oxide semiconductor (NMOS) gate-all-around (GAA) transistor on the substrate, wherein the NMOS GAA transistor comprises a first channel material. The semiconductor device may further include a P-type metal oxide semiconductor (PMOS) GAA transistor on the substrate, wherein the PMOS GAA transistor comprises a second channel material. The first channel material may have an electron mobility greater than an electron mobility of Silicon (Si) and the second channel material may have a hole mobility greater than a hole mobility of Si.

Certain aspects of the present disclosure provide a method for fabricating a semiconductor device. The method may include forming an N-type metal oxide semiconductor (NMOS) gate-all-around (GAA) transistor on a substrate, wherein the NMOS GAA transistor comprises a first channel material. The method may further include forming a P-type metal oxide semiconductor (PMOS) GAA transistor on the substrate, wherein the PMOS GAA transistor comprises a second channel material. The first channel material may have an electron mobility greater than an electron mobility of Silicon (Si) and the second channel material may have a hole mobility greater than a hole mobility of Si.

This summary has outlined the features and embodiments of the present disclosure so that the following detailed description may be better understood. Additional features and embodiments of the present disclosure will be described below. It should be appreciated by those skilled in the art that this disclosure may be readily utilized as a basis for modifying or designing other equivalent structures for carrying out the same purposes of the present disclosure. It should also be realized by those skilled in the art that such equivalent constructions do not depart from the teachings of the present disclosure as set forth in the appended claims. The features, which are believed to be characteristic of the present disclosure, both as to its organization and method of operation, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
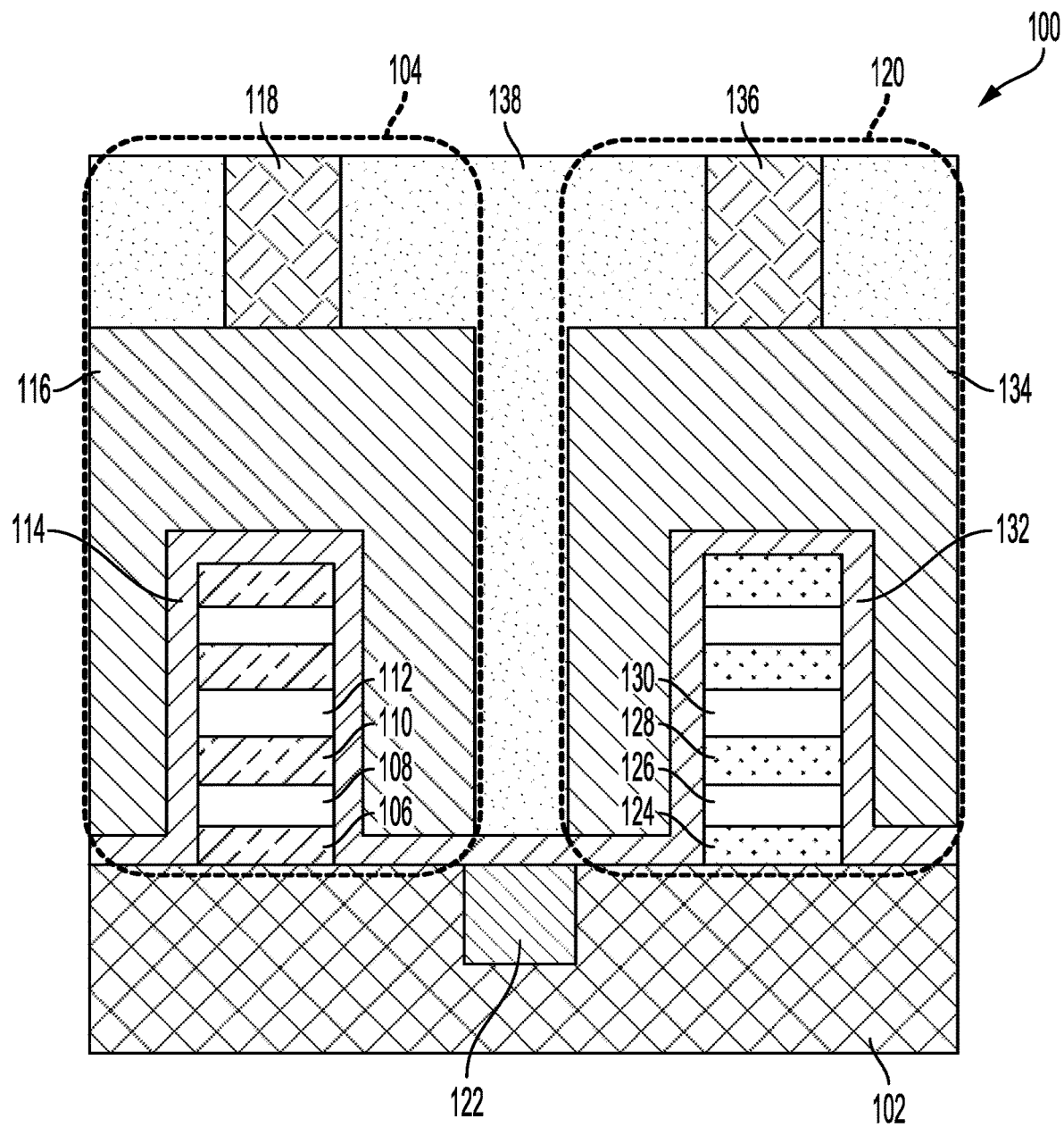
FIG. 1 illustrates an exemplary semiconductor device comprising an N-type metal oxide semiconductor (NMOS) gate-all-around (GAA) transistor and a P-type metal oxide semiconductor (PMOS) GAA transistor.

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The detailed description set forth below, in connection with the appended drawings, is intended as a description of various aspects and is not intended to represent the only aspect in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

FIG. 1 illustrates an exemplary semiconductor device comprising an N-type metal oxide semiconductor (NMOS) gate-all-around (GAA) transistor and a P-type metal oxide semiconductor (PMOS) GAA transistor. A semiconductor device 100 is shown in FIG. 1. The semiconductor device 100 comprises a substrate 102. As an example, the substrate 102 may comprise Silicon (Si). The semiconductor device 100 also comprises an NMOS GAA transistor 104 on the substrate 102. The NMOS GAA transistor 104 comprises multiple alternating gate layers and channel layers, such as a first gate layer 106 on the substrate 102, a first channel layer 108 on the first gate layer 106, a second gate layer 110 on the first channel layer 108, and a second channel layer 112 on the second gate layer 110. As an example, the first gate layer 106 and the second gate layer 110 may comprise Hafnium Oxide ($HfO_2$) and Titanium Aluminum Nitride (TiAlN). The first channel layer 108 and the second channel layer 112 may comprise Si. The NMOS GAA transistor 104 also comprises a first oxide layer 114 wrapped around the multiple alternating gate layers and channel layers. As an example, the first oxide layer 114 may comprise Silicon Dioxide ($SiO_2$). The NMOS GAA transistor 104 also comprises a first metal gate layer 116 wrapped around the first oxide layer 114. As an example, the first metal gate layer 116 may comprise Tungsten (W). The NMOS GAA transistor 104 further comprises a first gate contact 118 on the first metal gate layer 116. As an example, the first gate contact 118 may comprise W.

The semiconductor device 100 also comprises a PMOS GAA transistor 120 on the substrate 102. The semiconductor device 100 also comprises an isolation structure 122 between the NMOS GAA transistor 104 and the PMOS GAA transistor 120 to isolate the NMOS GAA transistor 104 from the PMOS GAA transistor 120. As an example, the isolation structure 122 may comprise a shallow trench isolation (STI) region. As an example, the STI region may comprise $SiO_2$. The PMOS GAA transistor 120 comprises multiple alternating gate layers and channel layers, such as a third gate layer 124 on the substrate 102, a third channel layer 126 on the third gate layer 124, a fourth gate layer 128 on the third channel layer 126, and a fourth channel layer 130 on the fourth gate layer 128. As an example, the third gate layer 124 and the fourth gate layer 128 may comprise $HfO_2$ and Titanium Nitride (TiN). The third channel layer 126 and the fourth channel layer 130 may comprise Si. The PMOS GAA transistor 120 also comprises a second oxide layer 132 wrapped around the multiple alternating gate layers and channel layers. As an example, the second oxide layer 132 may comprise $SiO_2$. The PMOS GAA transistor 120 also comprises a second metal gate layer 134 wrapped around the second oxide layer 132. As an example, the second metal gate layer 134 may comprise W. The PMOS GAA transistor 120 further comprises a second gate contact 136 on the second metal gate layer 134. As an example, the second gate contact 136 may comprise W. The semiconductor device 100 further comprises a dielectric layer 138 covering the NMOS GAA transistor 104 and the PMOS GAA transistor 120. As an example, the dielectric layer 138 may comprise at least one of $SiO_2$, Silicon Oxynitride, and Silicon Carbon Oxynitride.

Charge mobility of channel materials can affect the performance of GAA transistors. Charge mobility includes electron mobility for NMOS and hole mobility for PMOS. Si has an electron mobility of 1400 $cm^2$/vs and a hole mobility of 450 $cm^2$/vs, which is low as compared to some other semiconductor materials. To improve the performance of GAA transistors, channel materials with higher charge mobility are desirable.

Figure 2:
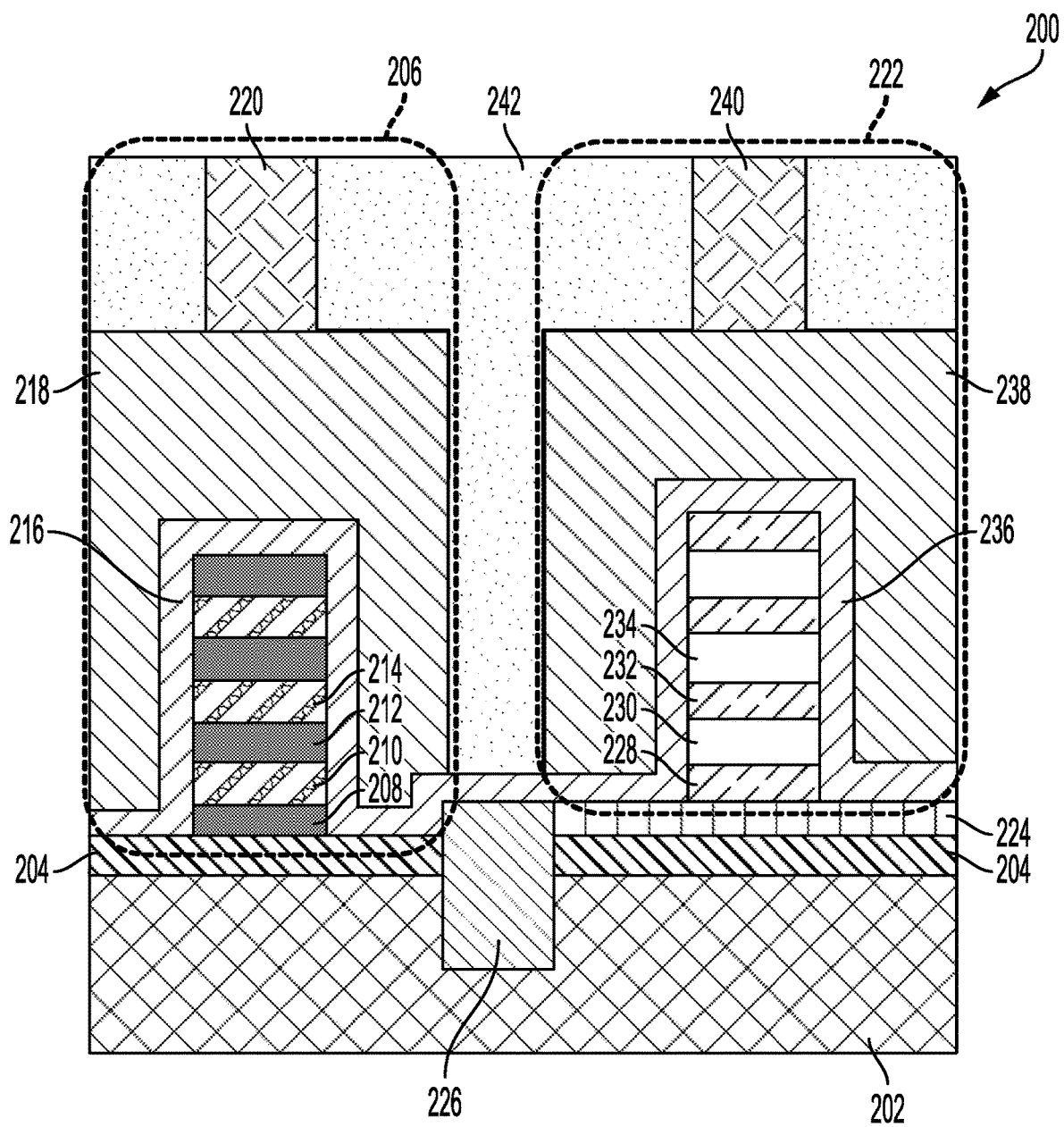
FIG. 2 illustrates an exemplary semiconductor device comprising an NMOS GAA transistor and a PMOS GAA transistor with high charge mobility channel materials in accordance with certain aspects of the present disclosure.

FIG. 2 illustrates an exemplary semiconductor device comprising an NMOS GAA transistor and a PMOS GAA transistor with high charge mobility channel materials in accordance with certain aspects of the present disclosure. A semiconductor device 200 is shown in FIG. 2. The semiconductor device 200 comprises a substrate 202. As an example, the substrate 202 may comprise at least one of Germanium (Ge), Gallium Arsenide (GaAs), Ge/Si (a Ge layer on a Si substrate), and GaAs/Si (a GaAs layer on a Si substrate). The semiconductor device 200 also comprises an etch stop layer 204 on the substrate 202. As an example, the etch stop layer 204 may comprise at least one of GaAs and Aluminum Arsenide (AlAs). The semiconductor device 200 also comprises an NMOS GAA transistor 206 on the etch stop layer 204. The NMOS GAA transistor 206 comprises multiple alternating gate layers and channel layers, such as a first gate layer 208 on the etch stop layer 204, a first channel layer 210 on the first gate layer 208, a second gate layer 212 on the first channel layer 210, and a second channel layer 214 on the second gate layer 212. As an example, the first gate layer 208 and the second gate layer 212 may comprise $HfO_2$ and TiAlN. The first channel layer 210 and the second channel layer 214 may comprise a semiconductor material with a higher electron mobility as compared to the electron mobility of Si, such as GaAs, which has an electron mobility of 8500 $cm^2$/vs. The NMOS GAA transistor 206 also comprises a first oxide layer 216 wrapped around the multiple alternating gate layers and channel layers. As an example, the first oxide layer 216 may comprise $SiO_2$. The NMOS GAA transistor 206 also comprises a first metal gate layer 218 wrapped around the first oxide layer 216. As an example, the first metal gate layer 218 may comprise W. The NMOS GAA transistor 206 further comprises a first gate contact 220 on the first metal gate layer 218. As an example, the first gate contact 220 may comprise W.

The semiconductor device 200 also comprises a PMOS GAA transistor 222 on an isolation layer 224. The isolation layer 224 is between the PMOS GAA transistor 222 and the etch stop layer 204. As an example, the isolation layer 224 may comprise N-type doped Ge. The semiconductor device 200 also comprises an isolation structure 226 between the NMOS GAA transistor 206 and the PMOS GAA transistor 222 to isolate the NMOS GAA transistor 206 from the PMOS GAA transistor 222. As an example, the isolation structure 226 may comprise an STI region. As an example, the STI region may comprise $SiO_2$. The PMOS GAA transistor 222 comprises multiple alternating gate layers and channel layers, such as a third gate layer 228 on the isolation layer 224, a third channel layer 230 on the third gate layer 228, a fourth gate layer 232 on the third channel layer 230, and a fourth channel layer 234 on the fourth gate layer 232. As an example, the third gate layer 228 and the fourth gate layer 232 may comprise $HfO_2$ and TiN. The third channel layer 230 and the fourth channel layer 234 may comprise a semiconductor material with a higher hole mobility as compared to the hole mobility of Si, such as Ge, which has a hole mobility of 1900 $cm^2$/vs. The PMOS GAA transistor 222 also comprises a second oxide layer 236 wrapped around the multiple alternating gate layers and channel layers. As an example, the second oxide layer 236 may comprise $SiO_2$. The PMOS GAA transistor 222 also comprises a second metal gate layer 238 wrapped around the second oxide layer 236. As an example, the second metal gate layer 238 may comprise W. The PMOS GAA transistor 222 further comprises a second gate contact 240 on the second metal gate layer 238. As an example, the second gate contact 240 may comprise W. The semiconductor device 200 further comprises a dielectric layer 242 covering the NMOS GAA transistor 206 and the PMOS GAA transistor 222. As an example, the dielectric layer 242 may comprise at least one of $SiO_2$, Silicon Oxynitride, and Silicon Carbon Oxynitride.

As mentioned above, charge mobility of channel materials can affect the performance of GAA transistors. Thus, the performance of GAA transistors can be improved by replacing Si in the channel layers with high charge mobility materials, such as GaAs for NMOS GAA transistors and Ge for PMOS GAA transistors as shown in the semiconductor device 200.

Figure 3A:
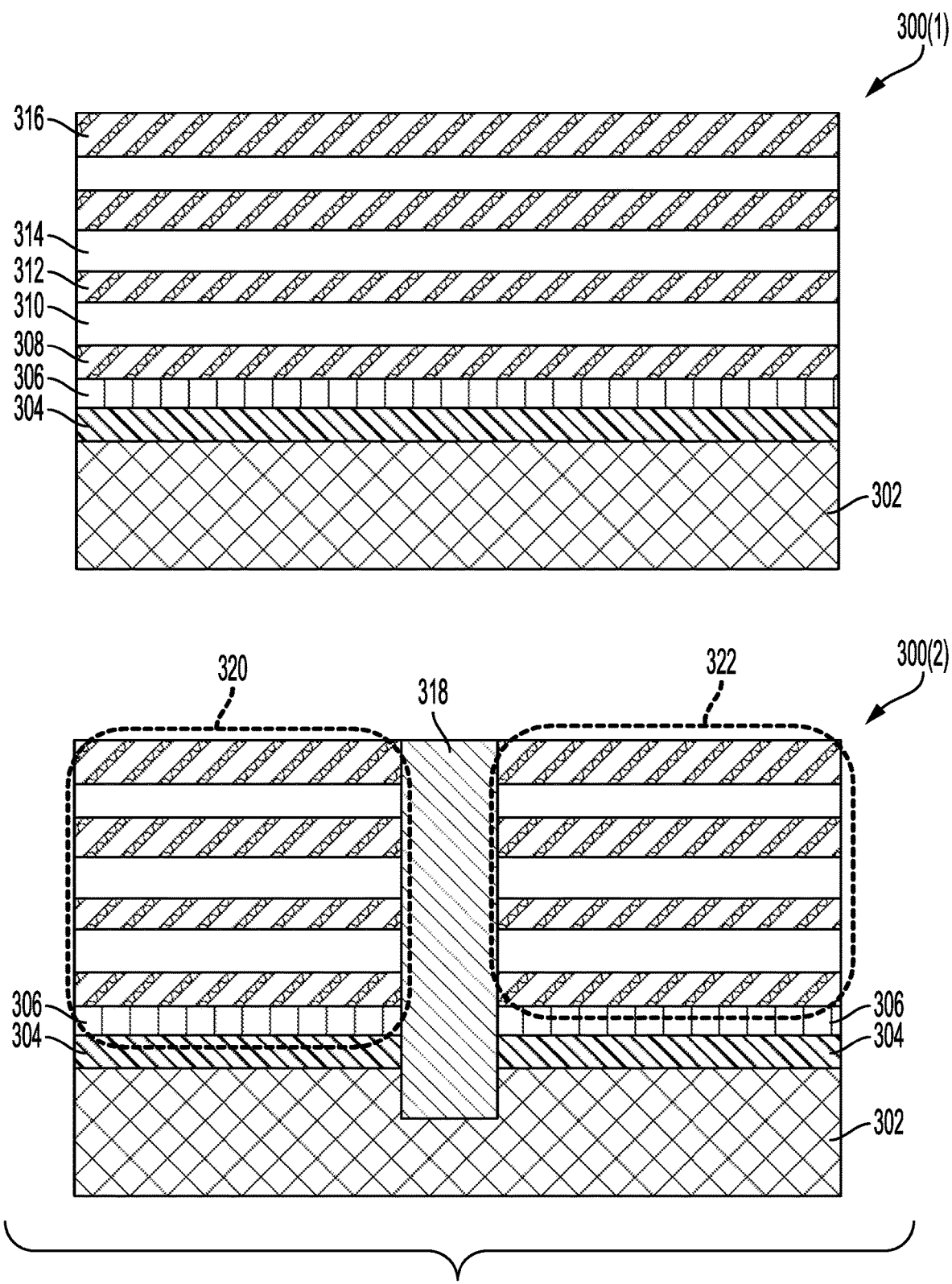
FIGS. 3A-3F illustrate an exemplary fabricating process for the semiconductor device in FIG. 2 in accordance with certain aspects of the present disclosure.

FIGS. 3A-3F illustrate an exemplary fabricating process for the semiconductor device 200 in FIG. 2 in accordance with certain aspects of the present disclosure. In FIG. 3A, stage 300(1) includes forming an etch stop layer 304 on a substrate 302. As an example, the substrate 302 may comprise at least one of Ge, GaAs, Ge/Si, and GaAs/Si. The etch stop layer 304 may comprise at least one of GaAs and AlAs. The etch stop layer 304 may be lattice matched with the substrate 302. Stage 300(1) also includes forming an isolation layer 306 on the etch stop layer 304. As an example, the isolation layer 306 may comprise N-typed doped Ge. The isolation layer 306 may be formed by epitaxy growth. Stage 300(1) further includes forming multiple alternating layers of a first material and a second material on the isolation layer 306. The multiple alternating layers of the first material and the second material may be formed by epitaxy growth. As an example, the multiple alternating layers of the first material and the second material may comprise a first GaAs layer 308 on the isolation layer 306, a first Ge layer 310 on the first GaAs layer 308, a second GaAs layer 312 on the first Ge layer 310, and a second Ge layer 314 on the second GaAs layer 312. A last layer 316 of the multiple alternating layers of the first material and the second material may comprise a GaAs layer. Because lattice constants of GaAs and Ge are close, epitaxy layers of GaAs and Ge can be formed on each other with few defects.

In FIG. 3A, stage 300(2) includes forming an STI region 318. As an example, the STI region 318 may comprise $SiO_2$. The STI region 318 divides the multiple alternating layers of the first material and the second material and the isolation layer 306 into a first multilayer structure 320 and a second multilayer structure 322. The first multilayer structure 320 can be used to form an NMOS GAA transistor. The second multilayer structure 322 can be used to form a PMOS GAA transistor. The STI region 318 extends through the multiple alternating layers of the first material and the second material, the isolation layer 306, and the etch stop layer 304 into the substrate 302.

Figure 3B:
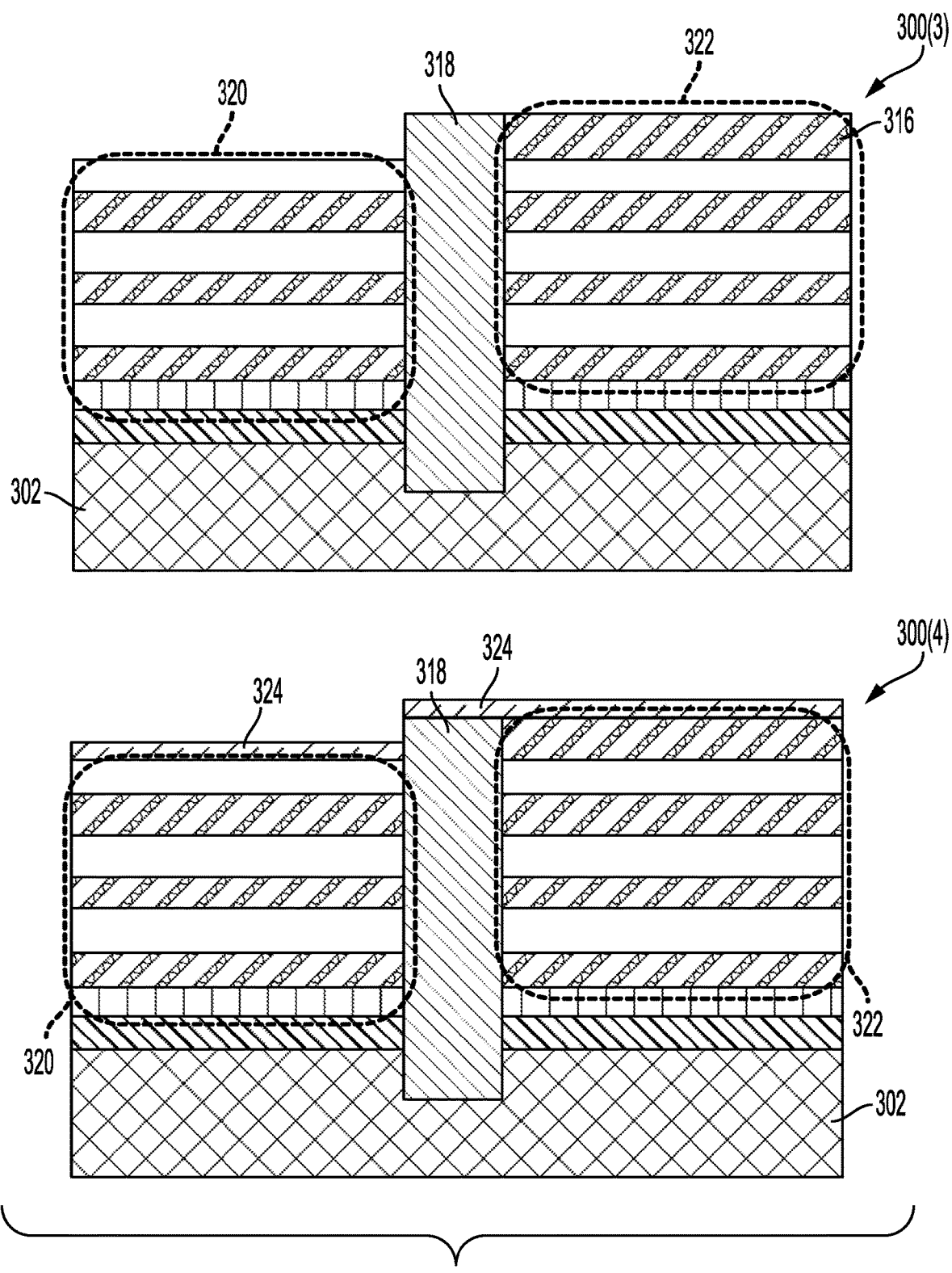

In FIG. 3B, stage 300(3) includes removing the last layer 316 of the multiple alternating layers of the first material and the second material from the first multilayer structure 320. The last layer 316 may be removed by either wet etch or dry etch.

In FIG. 3B, stage 300(4) includes forming a first hard mask layer 324 on the first multilayer structure 320, the second multilayer structure 322, and the STI region 318. As an example, the first hard mask layer 324 may comprise Silicon Nitride (SiN).

Figure 3C:
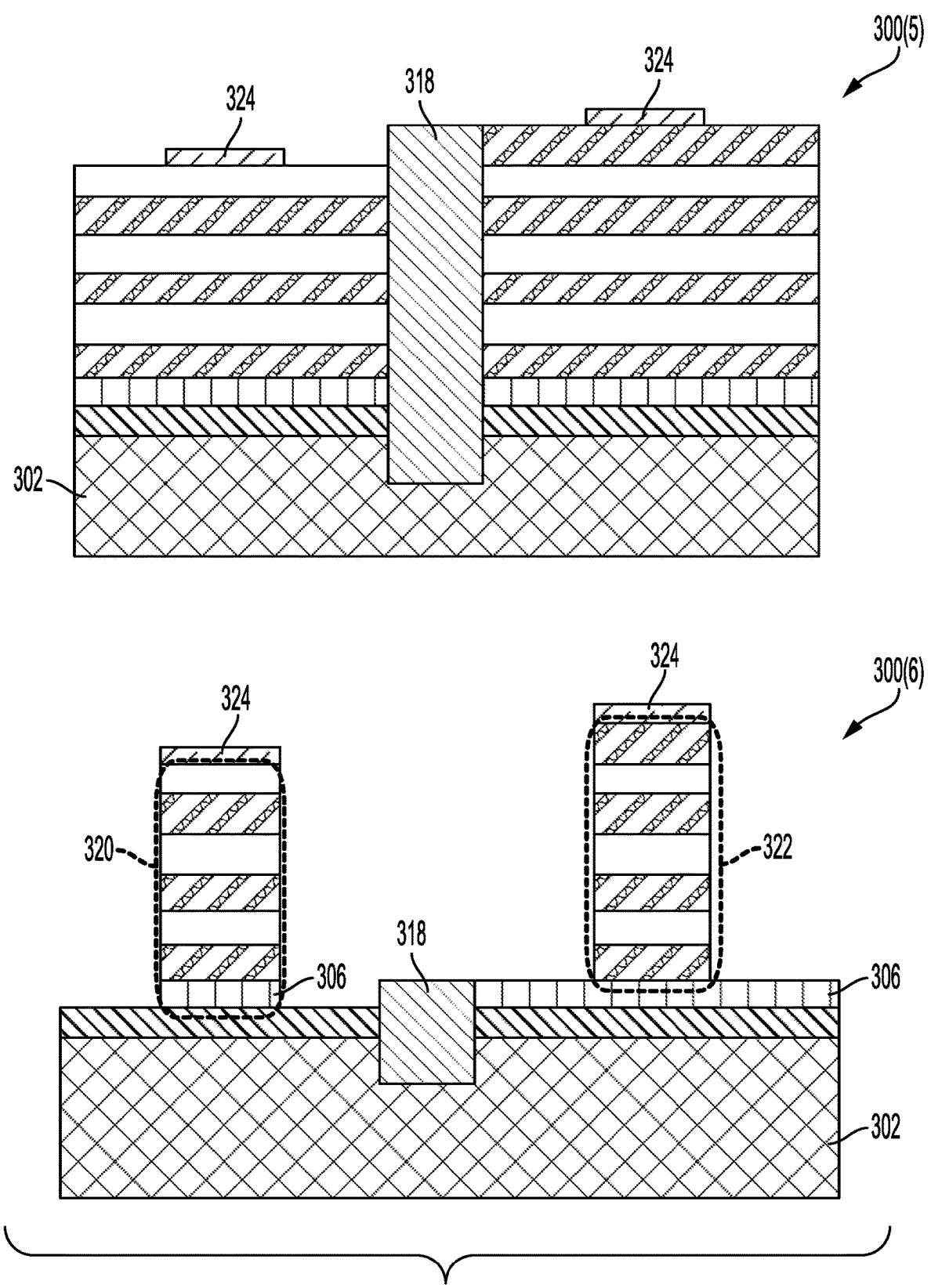

In FIG. 3C, stage 300(5) includes patterning the first hard mask layer 324.

In FIG. 3C, stage 300(6) includes patterning the multiple alternating layers of the first material and the second material and the isolation layer 306 in the first multilayer structure 320 based on the patterned first hard mask layer 324. The multiple alternating layers of the first material and the second material and the isolation layer 306 in the first multilayer structure 320 may be patterned by either wet etch or dry etch. Stage 300(6) also includes patterning the multiple alternating layers of the first material and the second material in the second multilayer structure 322 based on the patterned first hard mask layer 324. The multiple alternating layers of the first material and the second material in the second multilayer structure 322 may be patterned by either wet etch or dry etch. Stage 300(6) further includes patterning the STI region 318. The STI region 318 may be patterned by either wet etch or dry etch.

Figure 3D:
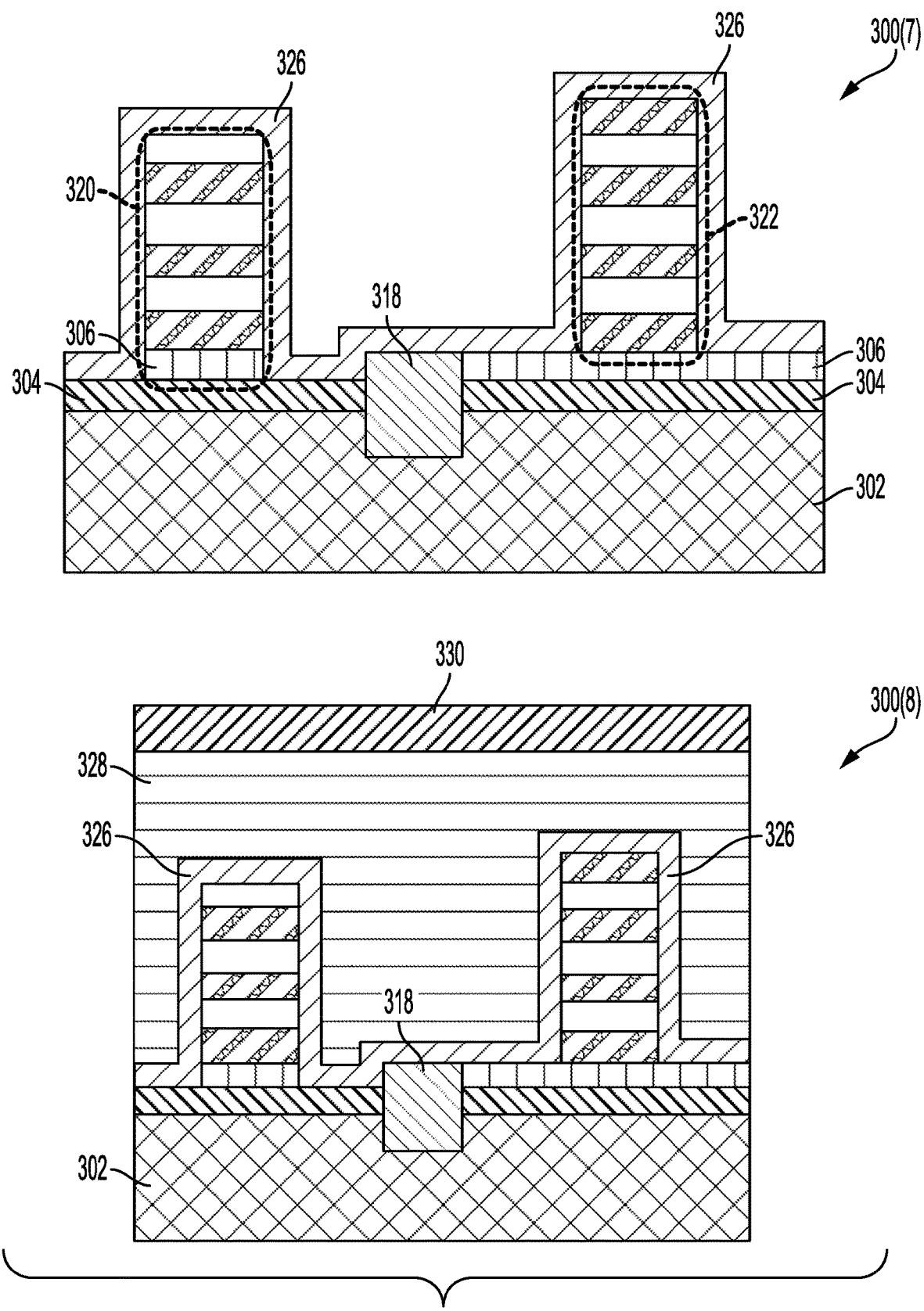

In FIG. 3D, stage 300(7) includes removing the first hard mask layer 324. Stage 300(7) further includes forming an oxide layer 326 covering the first multilayer structure 320, the second multilayer structure 322, the STI region 318, the exposed etch stop layer 304, and the exposed isolation layer 306. As an example, the oxide layer 326 may comprise $SiO_2$.

In FIG. 3D, stage 300(8) includes forming a dummy layer 328 on the oxide layer 326. As an example, the dummy layer 328 may comprise poly Si. Stage 300(8) also includes planarizing the dummy layer 328 using Chemical Mechanical Polishing (CMP). Stage 300(8) further includes forming a second hard mask layer 330 on the dummy layer 328. As an example, the second hard mask layer 330 may comprise SiN.

Figure 3E:
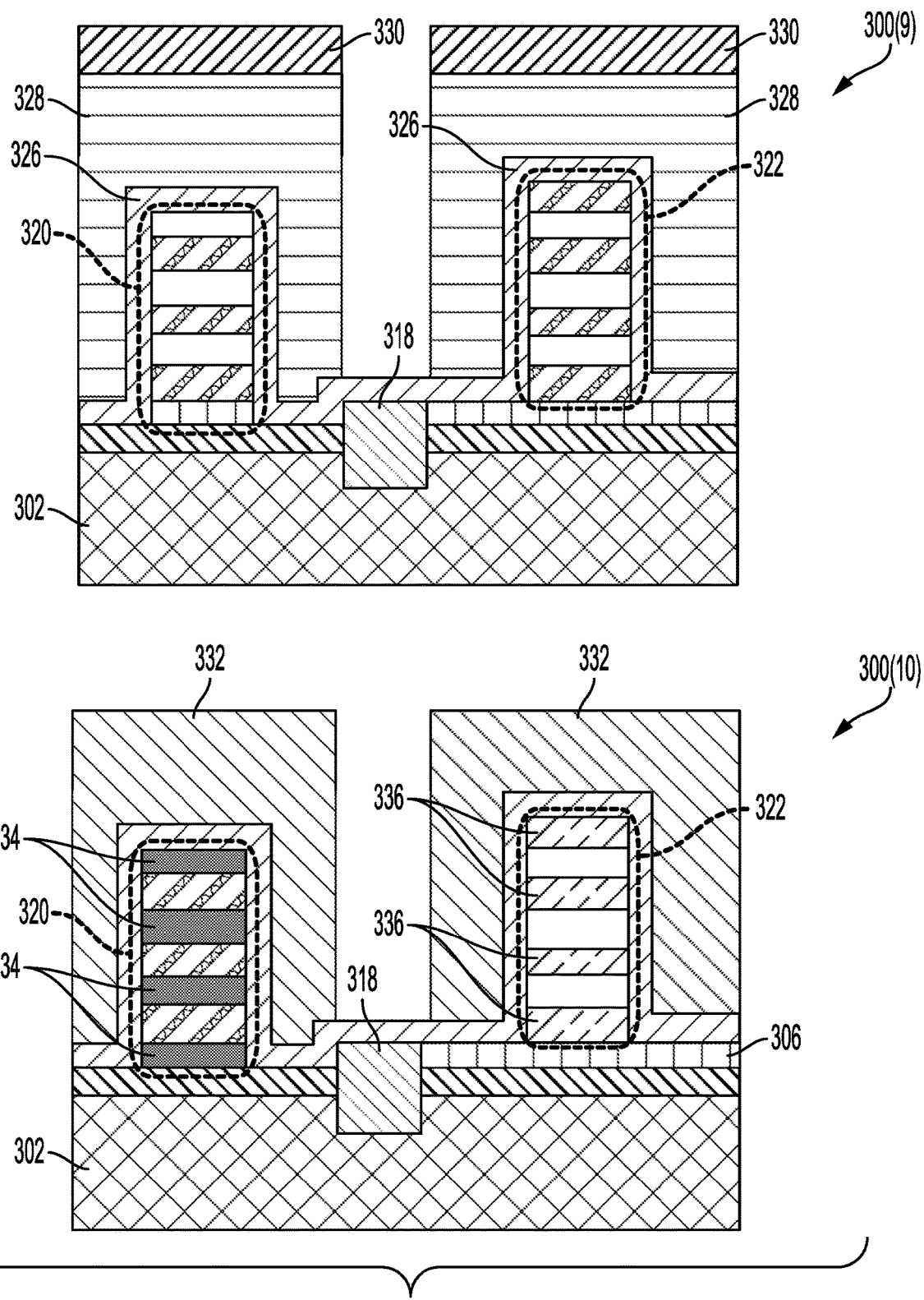

In FIG. 3E, stage 300(9) includes patterning the second hard mask 330 and the dummy layer 328 to separate the first multilayer structure 320 from the second multilayer structure 322. The second hard mask layer 330 and the dummy layer 328 between the first multilayer structure 320 and the second multilayer structure 322 may be removed by etching the second hard mask layer 330 and the dummy layer 328 between the first multilayer structure 320 and the second multilayer structure 322 using the oxide layer 326 as an etch stop.

In FIG. 3E, stage 300(10) includes removing the second hard mask layer 330. Stage 300(10) also includes replacing the dummy layer 328 with a metal gate layer 332. As an example, the metal gate layer 332 may comprise W. Stage 300(10) also includes in the first multilayer structure 320, removing layers of the first material from the multiple alternating layers of the first material and the second material. As an example, the layers of the first material may comprise Ge. Stage 300(10) also includes in the first multilayer structure 320, removing the isolation layer 306. The layers of the first material and the isolation layer 306 may be removed by wet etch. Stage 300(10) also includes forming a first plurality of gate layers 334 in place of the layers of the first material and the isolation layer 306 in the first multilayer structure 320. As an example, the first plurality of gate layers 334 may comprise $HfO_2$ and TiAlN. The first plurality of gate layers 334 may be formed by atomic layer conformal fill. After this process, the first multilayer structure 320 comprises alternating layers of the second material from the multiple alternating layers of the first material and the second material and the first plurality of gate layers 334. As an example, the layers of the second material may comprise GaAs, which can be used as channel materials for NMOS GAA transistors. Thus, the first multilayer structure 320 can be used to form an NMOS GAA transistor. Stage 300(10) also includes in the second multilayer structure 322, removing layers of the second material from the multiple alternating layers of the first material and the second material. As an example, the layers of the second material may comprise GaAs. The layers of the second material may be removed by wet etch. Stage 300(10) further includes forming a second plurality of gate layers 336 in place of the layers of the second material in the second multilayer structure 322. As an example, the second plurality of gate layers 336 may comprise $HfO_2$ and TiN. The second plurality of gate layers 336 may be formed by atomic layer conformal fill. After this process, the second multilayer structure 322 comprises alternating layers of the first material from the multiple alternating layers of the first material and the second material and the second plurality of gate layers 336. As an example, the layers of the first material may comprise Ge, which can be used as channel materials for PMOS GAA transistors. Thus, the second multilayer structure 322 can be used to form a PMOS GAA transistor. Both the first multilayer structure 320 and the second multilayer structure 322 may have channel materials with higher charge mobility as compared to the charge mobility of Si. Thus, the performance of GAA transistors can be improved using the first multilayer structure 320 and the second multilayer structure 322.

Figure 3F:
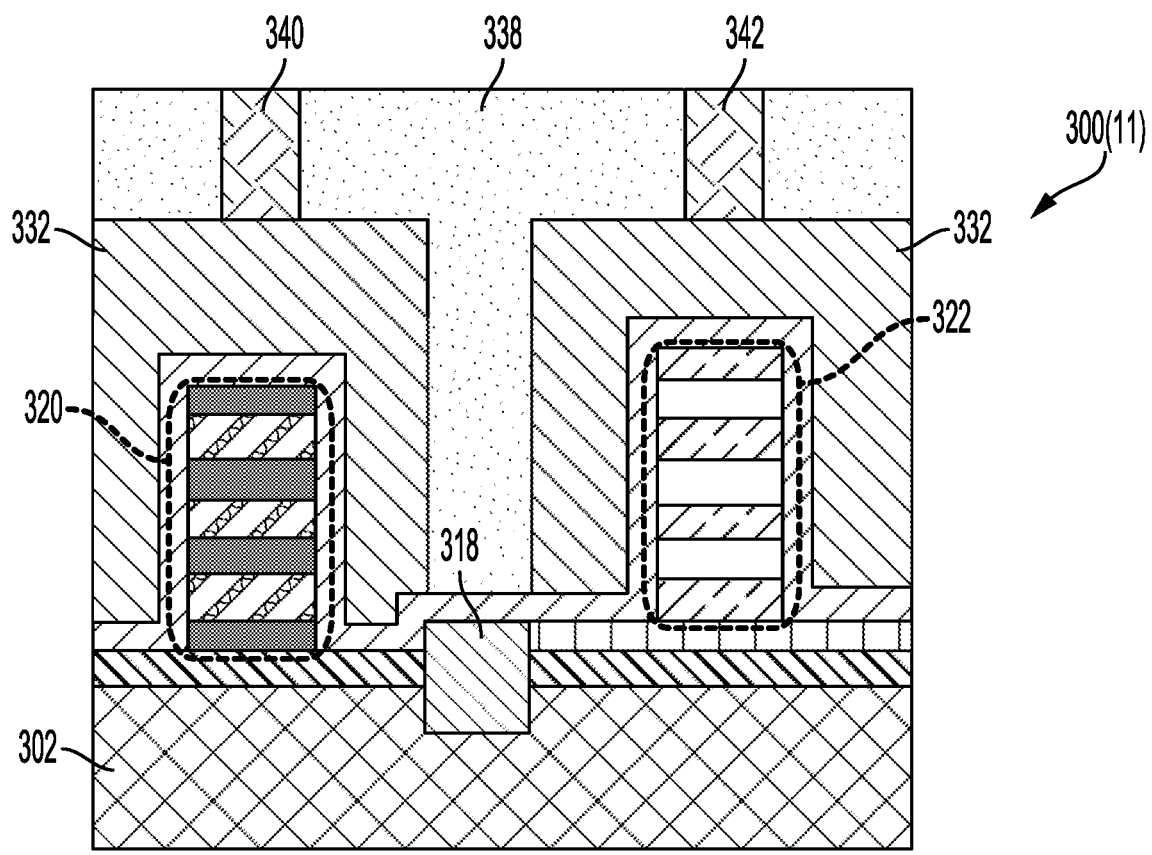

In FIG. 3F, stage 300(11) includes forming a dielectric layer 338 covering the metal gate layer 332. As an example, the dielectric layer 338 may comprise at least one of $SiO_2$, Silicon Oxynitride, and Silicon Carbon Oxynitride. Stage 300(11) also includes planarizing the dielectric layer 338 using CMP. Stage 300(11) further includes forming a first gate contact 340 for the first multilayer structure 320 and forming a second gate contact 342 for the second multilayer structure 322. As an example, the first gate contact 340 and the second gate contact 342 may comprise W.

The semiconductor device comprising the NMOS GAA transistor and the PMOS GAA transistor with high charge mobility channel materials according to certain aspects disclosed herein may be provided in or integrated into any electronic device. Examples, without limitation, include a set top box, an entertainment unit, a navigation device, a communication device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, and a drone.

Figure 4:
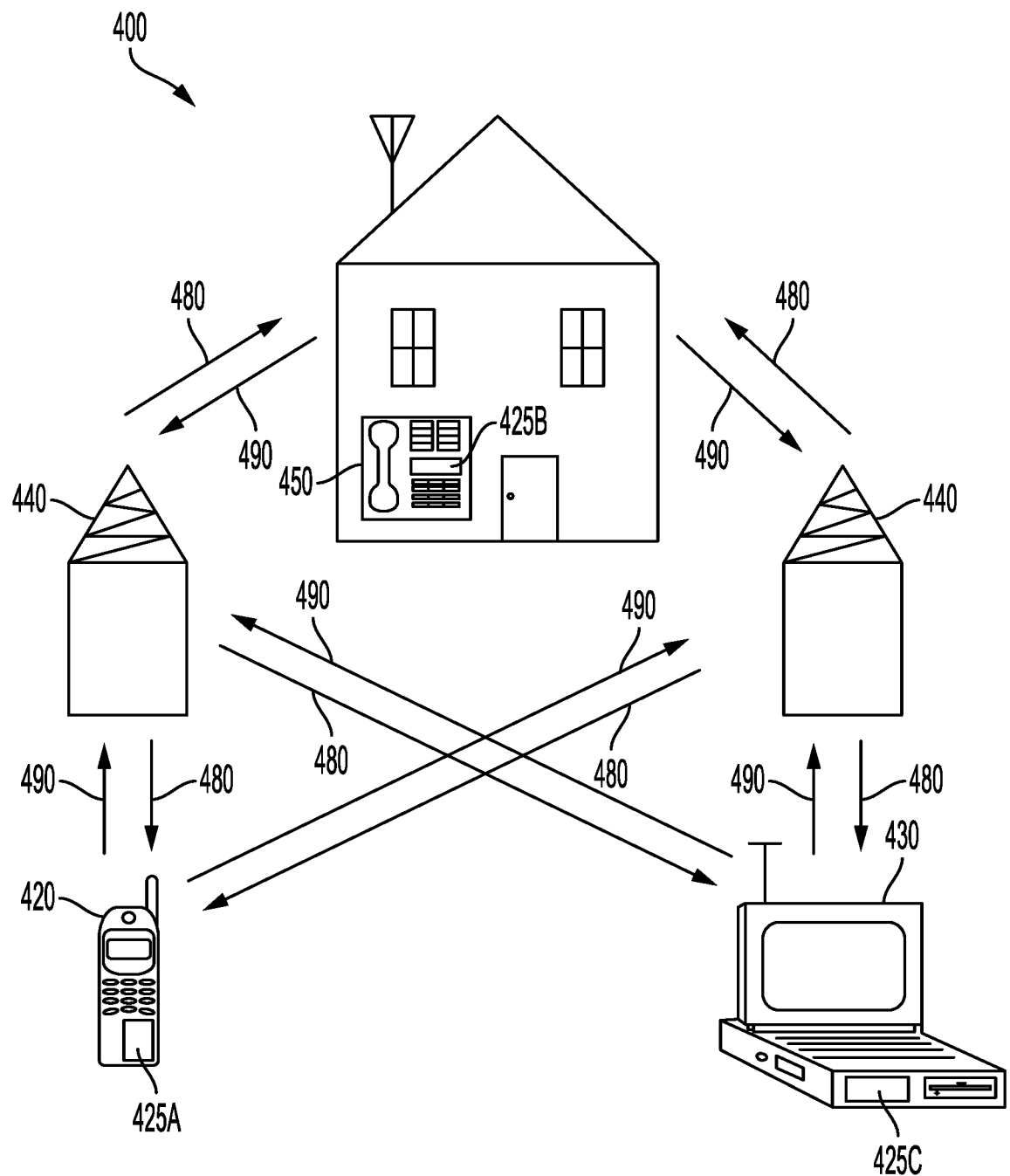
FIG. 4 is a block diagram showing an exemplary wireless communication system in which an aspect of the present disclosure may be employed.

FIG. 4 is a block diagram showing an exemplary wireless communication system 400 in which an aspect of the present disclosure may be employed. For purposes of illustration, FIG. 4 shows three remote units 420, 430, and 450 and two base stations 440. It will be recognized that wireless communication systems may have many more remote units and base stations. Remote units 420, 430, and 450 include integrated circuit (IC) devices 425A, 425C, and 425B that may include the disclosed semiconductor device. It will be recognized that other devices may also include the disclosed semiconductor device, such as the base stations, switching devices, and network equipment. FIG. 4 shows forward link signals 480 from the base stations 440 to the remote units 420, 430, and 450 and reverse link signals 490 from the remote units 420, 430, and 450 to the base stations 440.

In FIG. 4, remote unit 420 is shown as a mobile telephone, remote unit 430 is shown as a portable computer, and remote unit 450 is shown as a fixed location remote unit in a wireless local loop system. For example, a remote unit may be a mobile phone, a hand-held personal communication systems (PCS) unit, a portable data unit such as a PDA, a GPS enabled device, a navigation device, a set top box, a music player, a video player, an entertainment unit, a fixed location data unit, such as a meter reading equipment, or other communication device that stores or retrieves data or computer instructions, or combinations thereof. Although FIG. 4 illustrates remote units according to certain aspects of the present disclosure, the present disclosure is not limited to these exemplary illustrated units. Certain aspects of the present disclosure may be suitably employed in many devices, which include the disclosed semiconductor device.

Those of skill in the art will further appreciate that the various illustrative logical blocks, modules, circuits, and algorithms described in connection with certain aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in any flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and features disclosed herein.

The invention claimed is:

1. A semiconductor device, comprising:
   a substrate;
   an etch stop layer on the substrate;
   an isolation layer on top of the etch stop layer;
   an N-type metal oxide semiconductor (NMOS) gate-all-around (GAA) transistor directly on the etch stop layer, the NMOS GAA transistor comprising a first channel material; and
   a P-type metal oxide semiconductor (PMOS) GAA transistor directly on the isolation layer, the PMOS GAA transistor comprising a second channel material,
   wherein the first channel material has an electron mobility greater than an electron mobility of Silicon (Si) and the second channel material has a hole mobility greater than a hole mobility of Si.

2. The semiconductor device of claim 1, wherein the substrate comprises at least one of Germanium (Ge), Gallium Arsenide (GaAs), Ge/Si, and GaAs/Si.

3. The semiconductor device of claim 1, wherein the NMOS GAA transistor comprises a plurality of gate layers and a plurality of channel layers that alternate with one another, and wherein the plurality of channel layers comprise the first channel material.

4. The semiconductor device of claim 3, wherein the plurality of gate layers comprise Hafnium Oxide ($HfO_2$) and Titanium Aluminum Nitride (TiAlN).

5. The semiconductor device of claim 3, wherein the first channel material comprises GaAs.

6. The semiconductor device of claim 1, wherein the PMOS GAA transistor comprises a plurality of gate layers and a plurality of channel layers that alternate with one another, and wherein the plurality of channel layers comprise the second channel material.

7. The semiconductor device of claim 6, wherein the plurality of gate layers comprise $HfO_2$ and Titanium Nitride (TiN).

8. The semiconductor device of claim 6, wherein the second channel material comprises Ge.

9. The semiconductor device of claim 1, wherein the etch stop layer comprises at least one of GaAs and Aluminum Arsenide (AlAs).

10. The semiconductor device of claim 1, wherein the isolation layer comprises N-type doped Ge.

11. The semiconductor device of claim 1, further comprising an isolation structure between the NMOS GAA transistor and the PMOS GAA transistor.

12. The semiconductor device of claim 11, wherein the isolation structure comprises a shallow trench isolation (STI) region.

13. A method for fabricating a semiconductor device, comprising:
    forming an etch stop layer on a substrate;
    forming an isolation layer on top of the etch stop layer;
    forming an N-type metal oxide semiconductor (NMOS) gate-all-around (GAA) transistor directly on the etch stop layer, the NMOS GAA transistor comprising a first channel material; and
    forming a P-type metal oxide semiconductor (PMOS) GAA transistor directly on the isolation layer, the PMOS GAA transistor comprising a second channel material,
    wherein the first channel material has an electron mobility greater than an electron mobility of Silicon (Si) and the second channel material has a hole mobility greater than a hole mobility of Si.

14. The method of claim 13, wherein the NMOS GAA transistor comprises a plurality of gate layers and a plurality of channel layers that alternate with one another, and wherein the plurality of channel layers comprise the first channel material.

15. The method of claim 14, wherein the first channel material comprises Gallium Arsenide (GaAs).

16. The method of claim 14, wherein the PMOS GAA transistor comprises a plurality of gate layers and a plurality of channel layers that alternate with one another, and wherein the plurality of channel layers comprise the second channel material.

17. The method of claim 16, wherein the second channel material comprises Germanium (Ge).

18. The method of claim 14, wherein the substrate comprises at least one of Ge, GaAs, Ge/Si, and GaAs/Si.

* * * * *